United States Patent [19]

Stavov

[11] Patent Number: 5,083,030
[45] Date of Patent: Jan. 21, 1992

[54] DOUBLE-SIDED RADIATION-ASSISTED PROCESSING APPARATUS

[75] Inventor: Vladimir Stavov, Redwood City, Calif.

[73] Assignee: Applied Photonics Research, Menlo Park, Calif.

[21] Appl. No.: 668,734

[22] Filed: Mar. 12, 1991

Related U.S. Application Data

[63] Continuation of Ser. No. 555,803, Jul. 18, 1990, which is a continuation of Ser. No. 431,704, Nov. 1, 1989, abandoned, which is a continuation of Ser. No. 132,261, Dec. 14, 1987, abandoned.

[51] Int. Cl.$^5$ ............................................. G01N 21/00
[52] U.S. Cl. ................................ 250/453.1; 250/452.1
[58] Field of Search ............... 250/454.1, 455.1, 493.1, 250/494.1, 503.1, 504 R, 453.1, 492.1; 118/50.1, 620, 641, 642

[56] References Cited

U.S. PATENT DOCUMENTS

| | | | |
|---|---|---|---|
| 2,504,576 | 4/1950 | Partlo et al. ..................... | 250/455.1 |
| 2,876,187 | 3/1959 | Wolinski .......................... | 250/492.1 |
| 3,564,241 | 2/1971 | Ludwig ............................ | 250/454.1 |
| 3,612,866 | 10/1971 | Stevens ............................ | 250/461.1 |
| 3,634,025 | 1/1972 | Landry ............................. | 250/493.1 |
| 3,664,188 | 5/1972 | Kockott ........................... | 250/453.1 |
| 3,769,517 | 10/1973 | Coleman .......................... | 250/455.1 |
| 3,801,773 | 4/1974 | Matsumi ........................... | 219/349 |
| 3,985,100 | 10/1976 | Miller .............................. | 250/492.1 |
| 4,121,107 | 10/1978 | Bachmann ....................... | 250/492.1 |
| 4,443,533 | 4/1984 | Ponico ............................. | 250/492.1 |
| 4,516,527 | 5/1985 | Sugioka ........................... | 118/723 |
| 4,525,382 | 6/1985 | Sugioka ........................... | 427/54.1 |
| 4,558,660 | 12/1985 | Nishizawa et al. ................ | 118/725 |
| 4,585,671 | 4/1986 | Kitagawa et al. ................ | 427/54.1 |
| 4,596,935 | 6/1986 | Lumpp ............................. | 250/495.1 |
| 5,001,352 | 3/1991 | Tetzlaff ........................... | 250/453.1 |

FOREIGN PATENT DOCUMENTS 0774475  5/1957  United Kingdom.

OTHER PUBLICATIONS

Vig, "UV/Ozone Cleaning of Surfaces," Vac. Sci. Techn. A, vol. 3, No. 3, May/Dec. 1985.
Tabe, "UV/Ozone Cleaning of Silicon Substrates in Silicon Molecule-Beam Epitaxy," Appl. Phys. Lett., vol. 45, No. 10, Nov. 15, 1984.
Clarke, "UV/Ozone Processing: Its Applications in the Hybrid Circuit Industry," Hybrid Circuit Techn., Dec. 1985, p. 42.
Norstrom et al., "Dry Cleaning of Contact Holes Using UV Generated Ozone," J. Electrochem. Soc., Solid State Sci. and Techn., vol. 132, No. 9, Sep. 1985.

*Primary Examiner*—Bruce C. Anderson
*Attorney, Agent, or Firm*—Fliesler, Dubb, Meyer & Lovejoy

[57] ABSTRACT

A double-sided radiation-assisted processing apparatus includes a planar radiation source having first and second sides and providing radiation having an intensity $I_O$ at the surface of substrates provided on both the first and second sides of the radiation source. Accordingly, the radiation intensity utilized for processing is $2I_O$.

26 Claims, 5 Drawing Sheets

DOUBLE-SIDED RADIATION-ASSISTED PROCESSING APPARATUS

This application is a continuation of application Ser. No. 07/555,803, filed July 18, 1990, which is a continuation of application Ser. No. 07/431,704, filed Nov. 1, 1989, (now abandoned), which is a continuation of application Ser. No. 07/132,261, filed Dec. 14, 1987 (now abandoned).

BACKGROUND OF THE INVENTION

1. Field of the Invention

The present invention relates to an apparatus for performing radiation-assisted processing; more particularly, an apparatus for performing ultra-violet (UV) assisted cleaning of surfaces.

2. Description of the Related Art

Several types of radiation-assisted processing methods are currently in use, including rapid thermal processing (RTP), chemical vapor deposition (CVD), and UV/ozone cleaning. Rapid thermal processing is often performed using a radiation source which produces infrared (IR) heating, for example tungsten-halogen lamps which emit radiation having 70-80% of its wavelengths in the infrared range. Chemical vapor deposition can be accomplished using either mainly IR heating or by utilizing UV radiation in addition to IR radiation in order to speed up thermal reactions.

UV/ozone cleaning is performed using light sources which produce ultraviolet light, for example a lowpressure mercury lamp. Other uses for a processing apparatus producing ultraviolet radiation include photoresist removal and EPROM erasing. As used herein, radiation refers to electromagnetic radiation (or light) having wavelengths in the visible and near-visible range, including, for example, ultraviolet and infrared radiation.

The apparatus used for these various types of radiation-assisted processing are similar, and an apparatus designed for one type of radiation-assisted processing can easily be modified for use in another type of radiation-assisted processing by, for example, changing the radiation source. The UV/ozone cleaning process and an apparatus for performing same will be used, by way of example, to describe a conventional radiation-assisted processing apparatus.

In UV/ozone cleaning, a process which has been shown to be useful in the cleaning and preparation of, for example, silicon substrates, a substrate is placed in a reaction chamber having an oxygen containing ambient (for example, filtered air) and exposed to ultraviolet radiation. The ultraviolet radiation source is selected so that it produces radiation having wavelengths of 184.9 nm and 253.7 nm. The 184.9 nm wavelength is important because it is absorbed by oxygen, and it thus leads to the generation of ozone. The 253.7 nm radiation is not absorbed by oxygen; it therefore does not contribute to ozone ($O_3$) generation. However, 253.7 nm radiation is absorbed by many organic materials and also by ozone, as well as many products of the reaction of ozone with organic materials. The absorption of 253.7 nm radiation by ozone is principally responsible for the destruction of ozone in the reaction chamber. Therefore, when both wavelengths are present, ozone is continually being formed and destroyed. An intermediate product of both the formation and destruction of ozone is atomic oxygen, which is a very strong oxidizing agent. Radiation of 253.7 nm is also absorbed by organic materials and their ozonolysis products and causes a decomposition of the organics.

The UV/ozone cleaning process can be varied by providing ozone to the reaction chamber from an external source rather than generating the ozone with ultraviolet radiation.

The efficiency, and thus the time necessary for UV/ozone cleaning depends on the ambient atmosphere, the intensity of the ultraviolet radiation, the temperature of the material being cleaned, and the chemical composition and structure of the material being cleaned, the latter either providing a catalytic effect or extra stability. The intensity of ultraviolet radiation emitted from a discrete source, or a plurality of discrete sources, at the surface of a substrate to be cleaned can be increased by decreasing the distance between the source of the radiation and the substrate. However, it is beneficial to maintain a uniform flow of the ambient gas over the surface of the substrate to be cleaned, requiring that a gap remain between the substrate and the radiation source.

UV/ozone cleaning is discussed in the following papers: *Uv/ozone Cleaning of Surfaces*, John R. Vig, J. Vac. Sci. Technol. A, Vol 3, No. 3, May/June 1985; *UV/ozone Cleaning of Silicon Substrates in Silicon Molecular Beam Epitaxy*, Michiharu Tabe, Appl. Phys. Lett., Vol 45, No. 10, Nov. 15, 1984; *UV/ozone Processing: Its Applications in the Hybrid Circuit Industry*, F. K. Clarke, Hybrid Circuit Technology, Dec. 1985, page 42; and *Dry Cleaning of Contact Holes Using Ultraviolet (UV) Generated Ozone*, Norstrom, et al., J. Electrochem. Soc.: Solid-State Science and Technology, Vol. 132, No. 9, Sept. 1985, page 2285.

All radiation-assisted processing apparatus known to the inventor of the present invention which are capable of processing large substrates utilize a reflector to increase the intensity of the radiation used for processing. In particular, a reflector is used to redirect toward the substrate radiation which is otherwise directed away from the substrate by the radiation source. For example, in U.S. Pat. No. 4,558,660, reflectors are utilized for both ultraviolet and infrared producing radiation sources. U.S. Pat. No. 3,801,773 and the above-mentioned article entitled *UV/ozone Cleaning of Surfaces* illustrate some of the complexities and difficulties associated with the use of reflectors to enhance the radiation intensity at the surface of the substrate to be cleaned in order to reduce processing time.

Various materials have been utilized as reflectors for ultraviolet and infrared radiation and a great deal of time and effort has been spent in developing appropriate reflectors for radiation-assisted processing. Several problems are associated with reflectors, including the poor reflectivity of most metals, including gold and silver, in the ultraviolet range and the difficulty in preventing corrosion of a reflector subjected to UV and/or IR radiation. Aluminum is the preferred reflector; however, great efforts must be expended to prevent corrosion of the aluminum surface.

Furthermore, there are no 100% reflectors, and thus radiation (light) having an intensity $I_i$ when incident upon a reflector is reflected with an intensity $I_r$, where $I_r$ is always less than $I_i$. In addition, since the radiation source is situated between the substrate to be processed and the reflective surface a certain amount of the reflected radiation having intensity $I_r$ must pass through the radiation source before being incident on the substrate, causing a further decrease in the intensity of the reflected radiation. The reflected radiation which passes back through the radiation source has an intensity $I'_r$, where $I'_r > I_r$. The problem is illustrated in FIG. 1 in which radiation source 10 emits radiation in all directions. Some of the radiation is directly incident upon a substrate 14 supported on surface 12 and some of the radiation is directed toward reflector 16. Radiation emitted by radiation source 10 removed from the substrate 14 by a given distance has intensity $I_0$ at the surface of substrate 14. Three paths for radiation emitted by radiation source 10 are illustrated by $I_{i1}$, $I_{i2}$, and $I_{i3}$ in FIG. 1. $I_{i1}$ is radiation which passes directly from radiation source 10 to substrate 14 and strikes substrate 14 with intensity $I_i$. Radiation $I_{i2}$ is reflected by reflector 16, has a reflected intensity $I_{r2}$ ($I_{r2} < I_{i2}$), and then suffers a further reduction in intensity by passing back through radiation source 10 before striking substrate 14 with an intensity $I'_{r2}$, where $I'_{r2} << I_{i2}$. Radiation $I_{i3}$ is reflected by reflector 16 but does not pass back through radiation source 10, and thus strikes substrate 14 with intensity $I_{r3}$, again $I_{r3} < I_{i3}$. The intensity of radiation reflected by reflector 16 which is incident on substrate 14 varies between approximately 50% and approximately 75% of the intensity of radiation $I_0$ which is directly incident on substrate 14.

Moreover, as discussed above, ultraviolet radiation is absorbed by ozone. Therefore, as the ultraviolet radiation travels a greater distance before striking substrate 14, it suffers a reduction in intensity. The intensity decreases exponentially in accordance with Beer's absorption law: $I_x = I_0 e^{-ax}$, where x is the distance traveled by the radiation through an absorbing medium having an absorption coefficient a. Accordingly, the intensity of reflected radiation is always more greatly attenuated than the intensity of radiation traveling directly from a radiation source 10 to the substrate 14 because the reflected radiation travels an added distance equal to two times the distance between the radiation source 10 and reflector 16.

SUMMARY OF THE INVENTION

It is, therefore, an object of the present invention to provide an apparatus for radiation-assisted processing which does not suffer a loss in intensity caused by the use of a reflector.

Another object of the present invention is to provide an apparatus for radiation-assisted processing which does not require the use of a reflector.

A further object of the present invention is to provide a radiation-assisted processing apparatus which utilizes multiple radiation sources to simultaneously process a plurality of substrates.

A further object of the present invention is to provide a radiation-assisted processing apparatus in which the intensity of the radiation utilized for processing is two times the intensity of light emitted by the radiation source and directly incident on a substrate ($2I_O$) by placing substrates to be processed on opposite sides of a radiation source.

A double-sided processing apparatus for performing radiation-assisted processing of substrates according to the present invention includes a reaction chamber and a planar radiation source having first and second sides and providing an intensity $I_0$ at the surface of the substrate provided in the reaction chamber. First and second chucks for supporting substrates are provided in the chamber on the respective first and second sides of the planar radiation source so that the substrate supported by each of the first and second chucks receives incident radiation having an intensity $I_0$. The reaction chamber has a gas inlet and a gas outlet for providing a uniform flow of gas through the chamber. The chucks include heating elements for heating the substrates and may be designed to rotate the substrates. Alternatively, the radiation source may be located outside of a reaction chamber formed of a material which is substantially transparent to the radiation emitted by the radiation source.

The planar radiation source and the substrates are preferably arranged vertically in the reaction chamber to prevent the accumulation of contaminant particles on the substrates during processing.

A specific advantage of the radiation-assisted processing apparatus of the present invention is that the intensity utilized for processing is $2I_0$ which is much greater than the intensity $I_0 + I_R$ utilized in a processing apparatus relying on a reflector.

A further advantage of the radiation-assisted processing apparatus of the present invention is that for radiation source having a given area the apparatus of the present invention can process two substrates in a time which is only slightly greater than the time required for a conventional processing apparatus to process a single substrate having only half of the given area. Thus, the processing apparatus of the present invention has a higher processing rate per unit area of substrate.

A further advantage of the radiation-assisted processing apparatus of the present invention is that it is well suited to multiple substrate (batch) processing utilizing multiple radiation sources with double-sided chucks disposed between each pair of radiation sources.

A further advantage of the present invention is that is provides space savings over conventional radiation-assisted processing apparatus—at least some of the space savings being directly attributable to the elimination of a reflector.

A further advantage of the present invention is that it reduces the "footprint" (square footage) of a cleanroom apparatus.

DESCRIPTION OF THE PREFERRED EMBODIMENTS

Various embodiments of a radiation-assisted processing apparatus and several embodiments of a radiation source for use therewith will be described with reference to FIGS. 2-7. A radiation-assisted processing apparatus in accordance with the present invention is contemplated for use in the processing of large, substantially flat substrates. Examples of such substrates include silicon wafers, ceramics, data storage disks (both magnetic and optical), glass plates (for example photomask substrates), and printed circuit boards. Other substrates which could be processed using the apparatus of the present invention include lenses and mirrors. Thus, although certain portions of the following description are directed to UV/ozone processing of semiconductor substrates, it is to be understood that the apparatus of the present invention may be used for many types of radiation-assisted processing for large, substantially flat substrates.

Figure 1:
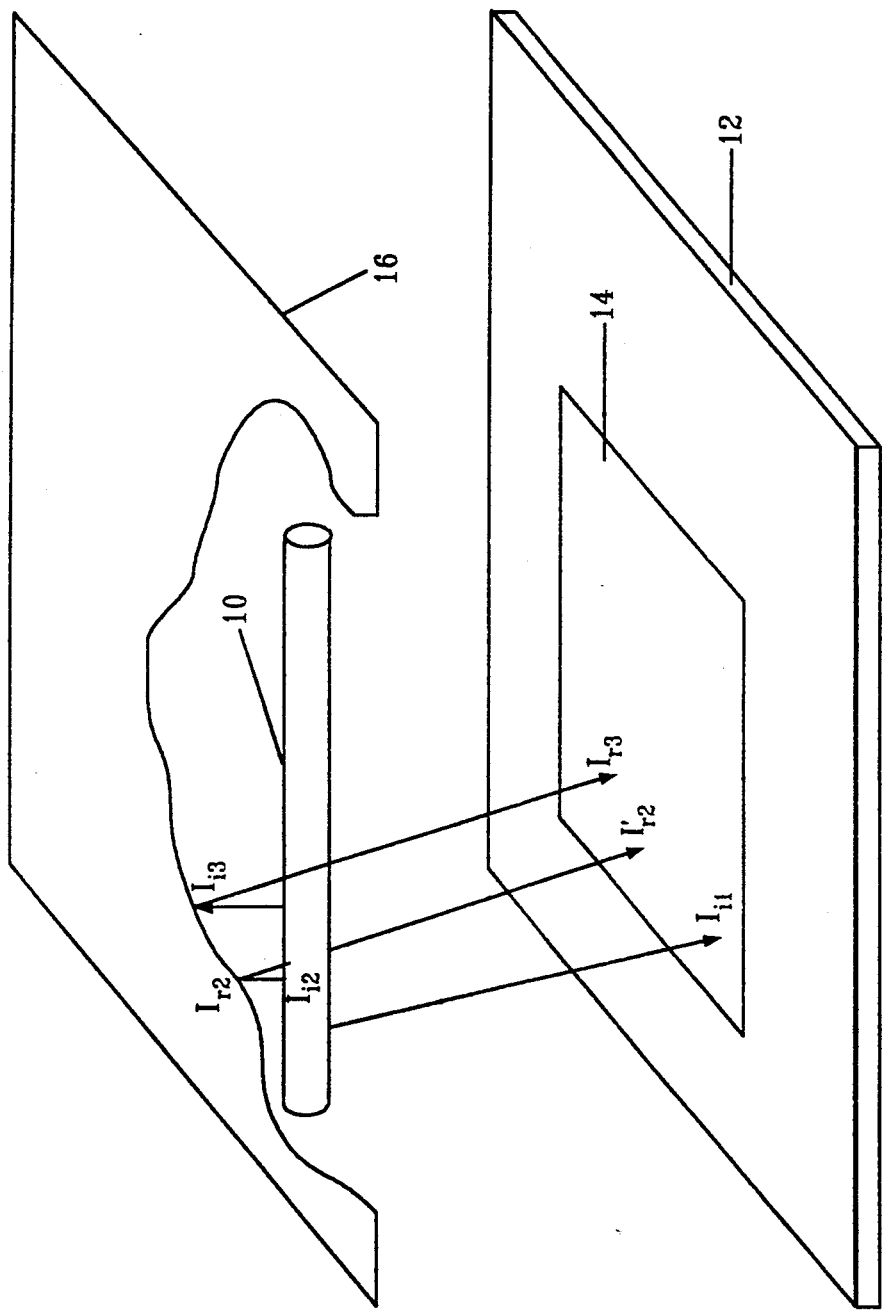
Fig 1 is an isometric, partial cutaway view of a conventional radiation-assisted processing apparatus.
Figure 2:
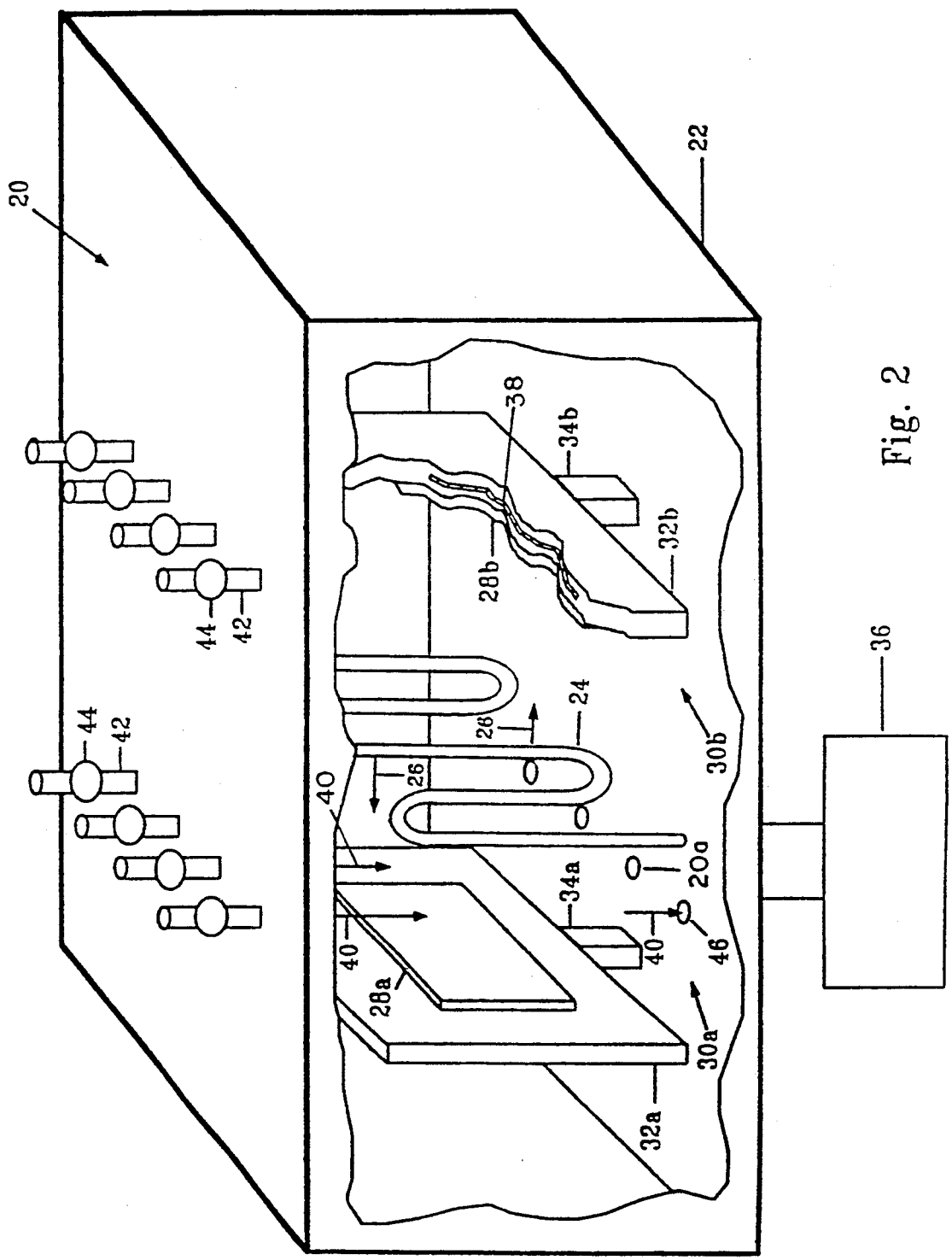
FIG. 2 is an isometric, partial cutaway view of a first embodiment of a radiation-assisted processing apparatus in accordance with the present invention.

A radiation-assisted processing apparatus in accordance with the first embodiment of the present invention will be described with reference to FIG. 2. The radiation-assisted processing apparatus 20 includes a reaction chamber 22 in which a radiation source 24 is supported. Radiation source 24 is a first embodiment of a planar array radiation source for use with a radiation-assisted processing apparatus in accordance with the present invention and has a serpentine shape which is selected so that a single radiation source can uniformly irradiate a large flat substrate. Radiation source 24 provides radiation 26 having an intensity $I_0$ at two substrates 28a, 28b, respectively positioned on first and second sides 30a, 30b of radiation source 24. The first and second substrates 28a, 28b are supported by respective ones of first and second chucks 32a, 32b.

In the first embodiment of the present invention, radiation source 24, first and second substrates 28a, 28b and first and second chucks 32a, 32b are arranged vertically in reaction chamber 22. Alternatively, these elements could be arranged horizontally in chamber 22 (see FIG. 5B). Vertically orienting chucks 32a, 32b and substrates 28a, 28b requires the provision of means for securing substrates 28a, 28b to chucks 32a, 32b. If the processing is conducted at atmospheric pressure, substrates 28a, 28b can be secured to chucks 32a, 32b by providing a vacuum chamber in each chuck 32, placing the back of the substrate 28 against the vacuum chamber, and then drawing a vacuum in the chamber. A line for connecting chucks 32 to means for drawing a vacuum (not shown) passes through chuck supports 34a, 34b. The benefit of the vertical orientation of substrates 28a, 28b is two-fold. First, contaminant particles are always present in the chamber 22 and the vertical orientation prevents these particles from landing on the substrates. Second, when the substrates are heated during processing it is difficult to maintain a uniform flow of gas past a heated horizontal substrate because the gas becomes heated and rises resulting in nonuniform convective flows and circulations.

Processing is conducted by applying the appropriate voltage, provided to power supply 36, to radiation source 24, thereby causing radiation source 24 to emit radiation of selected wavelengths. As discussed above, wavelengths mainly of 184.9 nm and 253.7 nm are utilized for UV/ozone cleaning. Wavelengths mainly in the infrared range would be selected for rapid thermal processing. It is also possible to utilize more than one radiation source to provide different types of radiation. For example, infrared and ultraviolet radiation can be combined in UV/ozone cleaning to enhance the cleaning process; it is known that the time required to perform UV/ozone cleaning can be decreased by heating the substrate being cleaned.

Another means of heating the substrate is to provide a heating element, for example, a resistive heating element 38 in chucks 32a, 32b. The electrical current necessary to operate a resistive heating element is provided through chuck supports 34a, 34b.

As discussed above, it is important to maintain a uniform flow of either the ambient gas or a reactive gas over the surface of the substrates 28a, 28b during processing. Indeed, a quasi-laminar flow over the surface of substrates 28a, 28b is desired. However, chucks 32a, 32b and substrates 28a, 28b are heated and will in turn heat gas flowing past them. Heating the gas has the effect of disturbing the flow because the heated gas tends to rise faster than non-heated gas. This detrimental effect is overcome in the apparatus of the present invention by creating an overall uniform downward gas flow. A gas 40 is introduced into chamber 22 through gas inlets 44 at a pressure which is monitored and controlled by pressure gauges/controllers 44. The gas is exhausted through holes 46 at the bottom of chamber 22. On the other hand, the gas flow may be in any direction in chamber 22 which provides the desired effects of providing fresh reactants at and removing the products of the reaction from the surfaces of the substrates 28a, 28b.

Radiation 26 emitted by radiation source 24 will be directly incident on both substrates 28a and 28b. Therefore, processing will be conducted utilizing an intensity of $2I_0$, $I_0$ at the surface of each substrate 28a, 28b. Accordingly, the processing apparatus of the present invention operates at a higher processing rate per unit area than conventional processors which utilize a processing intensity $I_0 + I_R$ for a single substrate, where $I_0 + I_R << 2I_0$.

Figure 3:
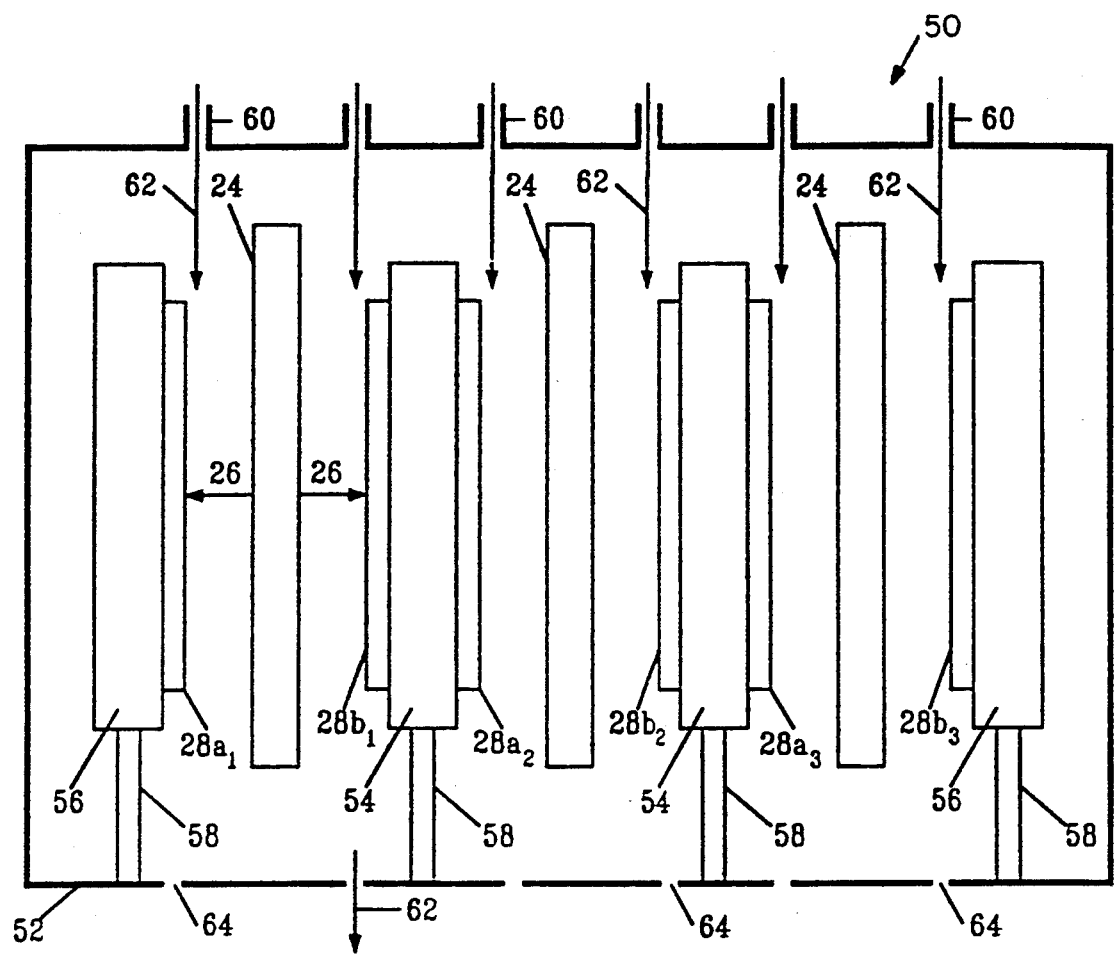
FIG. 3 is a cross-sectional view of a second embodiment of a radiation-assisted processing apparatus in accordance with the present invention.

A second embodiment of the present invention will be described with reference to FIG. 3. In the second embodiment of the present invention a batch concept is applied to the double-sided wafer processing apparatus of the first embodiment of the present invention by utilizing multiple radiation sources 24 in a single chamber 52. A plurality of first substrates $28a_{1-3}$ are provided on a first side of each of the plural radiation sources 24 and plural substrates $28b_{1-3}$ are provided on a second side of each radiation source 24. Doublesided chucks 54 are utilized between two radiation sources 24 and single-sided chucks 56 are utilized to hold a single substrate 28 at the ends of chamber 52. Double-sided chucks 54 and single sided chucks 56 are all supported on chuck supports 58. As in the first embodiment of the present invention, electrical current for operating resistance heaters in chucks 54, 56 and vacuum lines for drawing a vacuum in vacuum chambers in chucks 54, 56 to hold substrates thereto are provided in chuck supports 58. Gas inlets 60 supply gas 62 to create a uniform downward flow of gas 62 through chamber 52. Gas 62 is exhausted through ventilation or exhaust holes 64.

Figure 4:
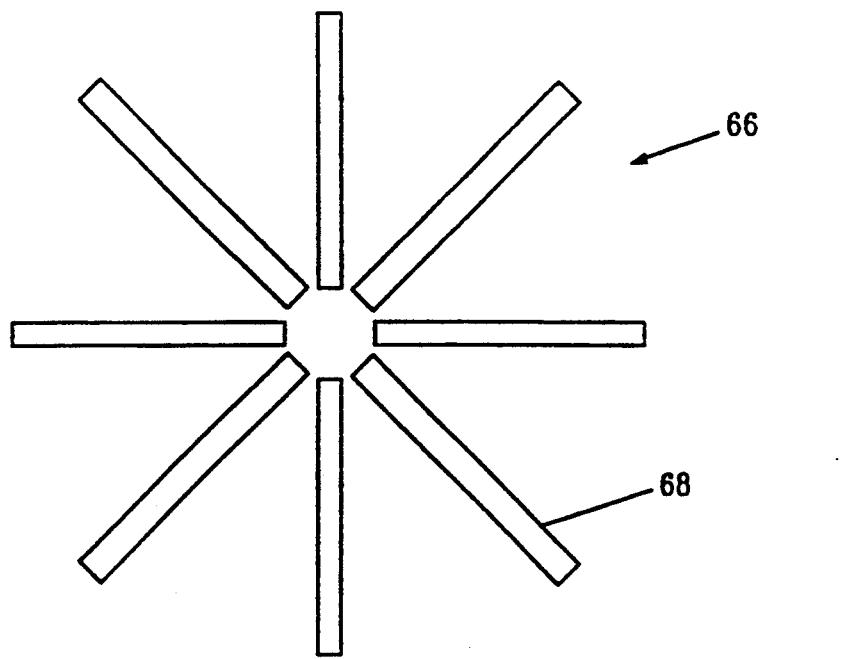
FIG. 4 is a plan view of a second embodiment of a planar array radiation source for use with the processing apparatus of the present invention.
Figure 5A:
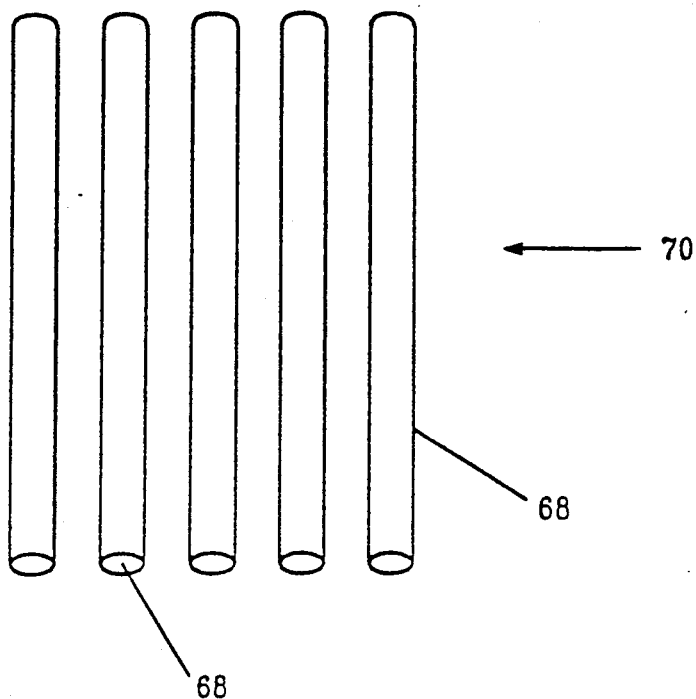
FIG. 5A is a plan view of a third embodiment of a planar array radiation source.
Figure 6:
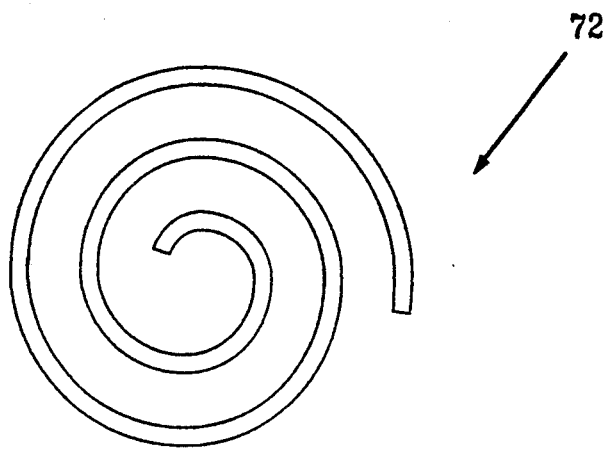
FIG. 6 is a plan view of a fourth embodiment of a planar array radiation source.

Alternative arrangements for a radiation source are illustrated in FIGS. 4, 5A and 6. In particular, a second embodiment of the radiation source 66 (FIG. 4) comprises plural linear radiation sources 68 arranged radially. A third embodiment of a radiation source 70 (FIG. 5A) comprises a plurality of linear radiation sources 68 arranged in parallel. A fourth embodiment of a radiation source 72 (FIG. 6) is a single-radiation source having a spiral shape.

Figure 5B:
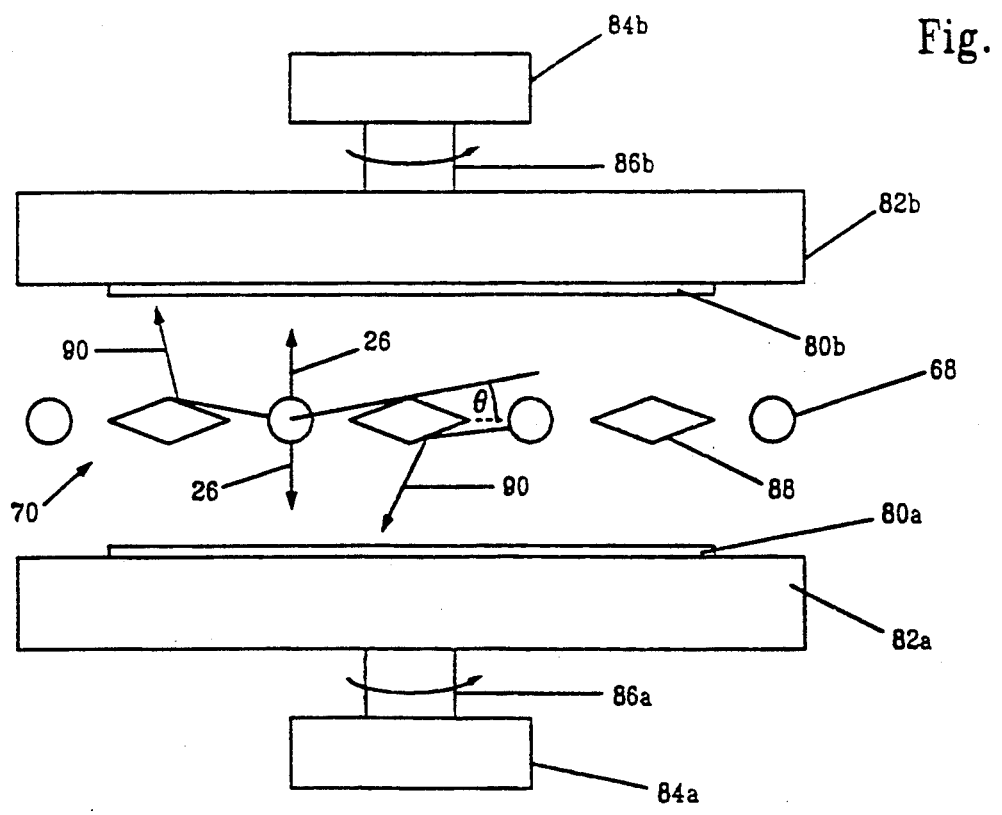
FIG. 5B is a cross-sectional view of a third embodiment of a radiation-assisted processing apparatus in accordance With the present invention utilizing the third embodiment of the planar array radiation source shown in FIG. 5A.

A radiation-assisted processing apparatus utilizing the third embodiment of the radiation source 70 (FIG. 5A) is illustrated in FIG. 5B. Radiation source 70 provides radiation 26 which is incident on first and second substrates 80a, 80b provided on first and second sides of radiation source 70. Substrates 80a, 80b are supported by rotatable chucks 82a, 82b which are rotated by rotating means 84a, 84b, for example, motors, connected to chucks 82a, 82b by shafts 86a, 86b. Substrates 88a, 88b may be held in place on chucks 82a, 82b by a vacuum as in the first and second embodiments of the present invention, or by other known positioning devices such as pins.

A further aspect of the processing device of the present invention shown in FIG. 5B (third embodiment) is that reflectors 88 are provided between adjacent radiation sources 68 which comprise the planar array radiation source 70. Reflectors 88 are shown in cross section in FIG. 5B; however, these reflectors are linear and extend over the length of individual radiation sources 68. (Similar reflectors can be provided for each of the other embodiments of the radiation source.) Reflectors 88 are shaped to reflect, toward substrates 80a, 80b, radiation emitted from radiation sources 68 in the plane of the planar radiation source 70 and at an angle less than a selected angle $\theta$ on either side of the plane of planar array radiation source 70. Radiation emitted at an angle of less than approximately $\theta$ would otherwise not be incident on substrates 80a, 80b or would travel such a large distance before being incident on substrates 80a, 80b as to have a greatly reduced intensity at the point of incidence. However, reflectors 88 do not reduce the intensity $I_0$ of radiation 26 directly incident on substrates 80a, 80b from planar array light source 70. Accordingly, the intensity of radiation incident on each substrate 80a, 80b is $I_0+I_R$, and the overall intensity utilized for processing is $2I_0+2I_R$.

Figure 7:
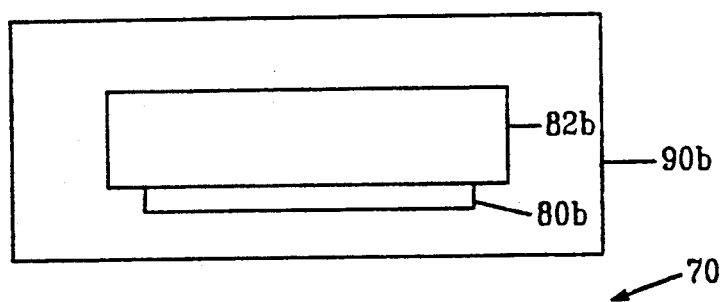
FIG. 7 is a cross-sectional view of a fourth embodiment of a radiation-assisted processing apparatus in accordance with the present invention.
Figure 7:
Figure 7:
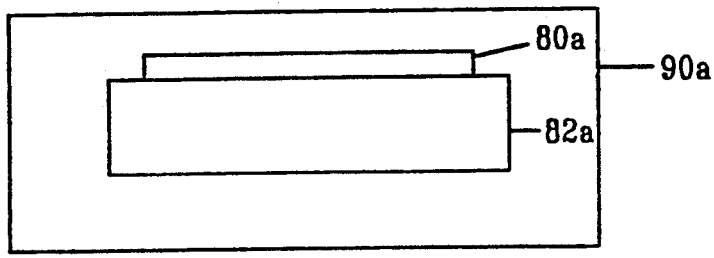

FIG. 7 illustrates a fourth embodiment of the present invention where a radiation source 70 is provided outside of reaction chambers 90a, 90b which contain substrates 80a, 80b supported on chucks 82a, 82b. This arrangement may also be utilized with plural light sources 70 and plural chambers 90 in a batch concept similar to the embodiment shown in FIG. 3. Additionally, FIG. 7 shows one of many alternate shapes for reflectors 92 provided in the plane of the radiation source 70.

In the embodiments shown in FIGS. 5B and 7 it is to be understood that the chucks 82 may be heated and comprise vacuum chambers for positioning substrates 80, and that means for supply and gas flow could be provided.

The many features and advantages of the radiation-assisted processing apparatus of the present invention will be apparent to those skilled in the art from the Description of the Preferred Embodiments. Thus, the following claims are intended to cover all modifications and equivalents falling within the scope of the invention.

What is claimed is:

1. A double-sided processing apparatus for processing first and second planar substrates, each planar substrate having an area, comprising:

support means for supporting said first and second planar substrates so that the planes of said substrates are substantially parallel; and planar radiation means, provided between and substantially parallel to said first and second substrates, for emitting radiation which uniformly irradiates each of said first and second substrates with radiation having an intensity $I_0$ so that processing using a radiation intensity of approximately $2I_0$ is performed without the aid of reflectors, said planar radiation means having an area greater than the area of any one of said first and second planar substrates.

2. A double-sided processing apparatus according to claim 1, further comprising a chamber, wherein said planar radiation means and said support means are provided in said chamber.

3. A double-sided processing apparatus according to claim 2, wherein said support means comprises first and second chuck means for supporting respective ones of the first and second substrates, said first and second chuck means having means for heating respective ones of the first and second substrates.

4. A double-sided processing apparatus according to claim 3, wherein said planar radiation source provides ultraviolet radiation and the processing is UV/ozone cleaning.

5. A double-sided processing apparatus according to claim 2, wherein said first and second chuck means rotate the first and second substrates in the plane of the first and second substrates.

6. A double-sided processing apparatus according to claim 5, wherein said planar radiation means and said first and second substrates are vertically oriented.

7. A double-sided processing apparatus according to claim 6, further comprising means for providing a gas flow from the top to the bottom of said chamber.

8. A double-sided processing apparatus according to claim 2, wherein said planar radiation means and said first and second substrates are vertically oriented.

9. A double-sided processing apparatus according to claim 8, further comprising means for providing a gas flow from the top to the bottom of said chamber.

10. A double-sided processing apparatus according to claim 1, further comprising first and second chambers, wherein said support means comprises first and second support means provided in respective ones of said first and second reaction chambers.

11. A double-sided processing apparatus according to claim 10, wherein said planar radiation means is external to said first and second reaction chambers.

12. A double-sided processing apparatus according to claim 11, wherein said planar radiation means and said first and second substrates are vertically oriented.

13. A double-sided processing apparatus according to claim 12, further comprising means for providing a gas flow from the top to the bottom of said first and second chambers.

14. A double-sided UV/ozone processing apparatus for processing first and second planar substrates, each planar substrate having an area, comprising:

a chamber;

a planar radiation source provided in said chamber for emitting ultraviolet radiation, said planar radiation source having first and second sides and an area greater than the area of any one of said first and second planar substrates; and support means for supporting the substrates on said first and second sides of said planar radiation source at fixed positions with respect to said planar radiation source so that each said substrate is uniformly irradiated with radiation of intensity $I_0$ emitted by said planar radiation means and so that processing is performed using a radiation intensity of approximately $2I_0$ without the use of reflectors.

15. A double-sided UV/ozone processing apparatus according to claim 14, further comprising means for introducing ozone into said chamber.

16. A double-sided UV/ozone processing apparatus according to claim 14, wherein said support means heat the substrates.

17. A double-sided UV/ozone processing apparatus according to claim 14, wherein said planar radiation source comprises a plurality of planar radiation sources arranged in a plane.

18. A double-sided UV/ozone processing apparatus according to claim 17, wherein said plurality of radiation sources are arranged radially.

19. A double-sided UV/ozone processing apparatus according to claim 14, wherein said planar radiation source comprises a single radiation source having a serpentine shape.

20. A double-sided UV/ozone processing apparatus according to claim 14, wherein said planar radiation source comprises a single radiation source arranged in a spiral.

21. A double-sided UV/ozone processing apparatus for processing substrates, each substrate having an area, comprising:
a planar radiation source for emitting UV radiation, said planar radiation source having first and second sides and an area greater than the area of any one of said substrates;
first and second chambers provided on respective ones of said first and second sides of said planar radiation source; and
first and second support means, provided in respective ones of said first and second chambers, for supporting substrates to be processed on said first and second sides of said planar radiation source at fixed positions with respect to said planar radiation source, so that each substrate is uniformly irradiated with UV radiation of intensity $I_0$.

22. An apparatus for performing radiation-assisted processing of plural planar substrates, each substrate having an area, comprising:
a plurality of planar radiation sources, each said radiation source having first and second sides, providing radiation having intensity $I_0$ at each of said first and second sides, and having an area greater than the area of any one of said planar substrates; and
support means for supporting at least one substrate at respective ones of the first and second sides of each of said planar radiation sources so that each substrate is substantially parallel with a corresponding one of said planar radiation sources and uniformly irradiated with radiation of intensity $I_0$, and so that each planar radiation source performs processing using a radiation intensity of approximately $2I_0$.

23. An apparatus according to claim 22, further comprising a chamber, wherein said radiation sources and support means are provided in said chamber.

24. An apparatus according to claim 22, further comprising plural chambers interleaved with said plurality of planar radiation sources, wherein said support means comprises a plurality of supports provided in respective ones of said chambers.

25. A reflectorless apparatus for performing radiation-assisted processing of substrates, each substrate having an area, comprising:
a chamber;
planar radiation means, positioned in said chamber and vertically oriented, for emitting radiation having an intensity, said planar radiation means having first and second sides and an area greater than the area of any one of said substrates;
first and second means, provided in said chamber on respective ones of said first and second sides of said planar radiation means, for supporting said substrates so that said substrates are vertically oriented in said chamber and substantially parallel with said planar radiation means, so that each substrate receives incident radiation of intensity $I_0$ in order that processing be conducted with a radiation intensity of approximately $2I_0$, and so that said substrates are supported at fixed positions with respect to said planar radiation means; and
gas supply means for providing a uniform vertical flow of a gas in said chamber.

26. An apparatus for performing radiation-assisted processing of substrates, comprising:
a chamber;
planar radiation means, positioned in said chamber and vertically oriented, for emitting radiation, said planar radiation means having first and second sides;
first and second means, provided in said chamber on respective ones of said first and second sides of said planar radiation means, for supporting said substrates so that said substrates are vertically oriented in said chamber and substantially parallel with said planar radiation means, so that each substrate receives incident radiation of intensity $I_0$ and so that said substrates are supported at fixed positions with respect to said planar radiation means;
gas supply means for providing a uniform vertical flow of a gas in said chamber; and
reflector means provided in the plane of said planar radiation means for reflecting, towards the substrates, radiation emitted from said planar radiation means at an angle from the plane of said planar radiation source less than a selected angle, so that each substrate receives incident radiation of intensity $I_0 + I_R$, where $I_R$ is the intensity provided at the substrate by said reflection means, and so that processing is conducted using a radiation intensity of approximately $2(I_0 + I_R)$.

* * * * *

UNITED STATES PATENT AND TRADEMARK OFFICE
CERTIFICATE OF CORRECTION

PATENT NO. : 5,083,030
DATED : January 21, 1992
INVENTOR(S) : Vladimir Starov

It is certified that error appears in the above-identified patent and that said Letters Patent is hereby corrected as shown below:

Title page, item 19, change "Stavov" to --Starov--.
Title page, item 75, change "Stavov" to --Starov--.
Column 3, line 3, change ">" to --<--.

Signed and Sealed this

Nineteenth Day of January, 1993

Attest:

DOUGLAS B. COMER

*Attesting Officer*  *Acting Commissioner of Patents and Trademarks*